US006124744A

United States Patent [19]
Oowaki

[11] Patent Number: 6,124,744
[45] Date of Patent: *Sep. 26, 2000

[54] ELECTRONIC CIRCUIT APPARATUS HAVING CIRCUITS FOR EFFECTIVELY COMPENSATING FOR CLOCK SKEW

[75] Inventor: Yukihito Oowaki, Kanagawa, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,743

[22] Filed: Mar. 26, 1997

[30] Foreign Application Priority Data

Mar. 26, 1996 [JP] Japan ...................................... 8-069583
Mar. 26, 1996 [JP] Japan ...................................... 8-069584

[51] Int. Cl.⁷ ...................................................... H03K 5/14
[52] U.S. Cl. ............................. 327/262; 327/233; 327/235
[58] Field of Search ............................... 327/3, 12, 154, 327/262, 291, 293, 298, 297, 233, 235

[56] References Cited

U.S. PATENT DOCUMENTS

| | | | |
|---|---|---|---|
| 4,494,021 | 1/1985 | Bell et al. | 327/262 |
| 4,623,805 | 11/1986 | Flora et al. | 327/152 |
| 4,751,469 | 6/1988 | Nakagawa et al. | 327/7 |
| 4,922,141 | 5/1990 | Lofgren et al. | 327/158 |
| 5,122,679 | 6/1992 | Ishii et al. | 327/147 |
| 5,272,390 | 12/1993 | Watson, Jr. et al. | 327/141 |
| 5,355,037 | 10/1994 | Andresen et al. | 327/158 |
| 5,414,381 | 5/1995 | Nelson et al. | 327/262 |
| 5,477,178 | 12/1995 | Maki | 327/161 |
| 5,521,541 | 5/1996 | Okamura | 327/297 |
| 5,570,045 | 10/1996 | Erdal et al. | 327/297 |
| 5,586,307 | 12/1996 | Wong et al. | 327/144 |
| 5,594,376 | 1/1997 | McBride et al. | 327/236 |
| 5,675,274 | 10/1997 | Kobayashi et al. | 327/158 |

FOREIGN PATENT DOCUMENTS 5-268206 10/1993 Japan .
8-54957 2/1996 Japan .

*Primary Examiner*—Terry D. Cunningham
*Attorney, Agent, or Firm*—Foley & Lardner

[57] ABSTRACT

The present invention relates to, more specifically, an electronic circuit apparatus having a main system portion and a subsystem portion connected to the main system portion. In the electronic circuit apparatus, at least either the main system or the subsystem comprises a clock source, a clock wire having an outgoing path and an incoming path, wherein a clock signal from the clock source is inputted from one end of the outgoing path, and at least one receiver connected to an optional position of the outgoing path, further connected to a position of the outgoing path adjacent to the optional position, for supplying a clock signal having an optional delay level relative to the clock signal from the clock source according to a delay level between each clock signal at the positions.

25 Claims, 16 Drawing Sheets

ELECTRIC POTENTIAL GENERATING CIRCUIT
FOR VARIABLE DELAY CIRCUIT

VARIABLE DELAY CIRCUIT DELAY PORTION $t_1 \neq t_2$

ELECTRONIC CIRCUIT APPARATUS HAVING CIRCUITS FOR EFFECTIVELY COMPENSATING FOR CLOCK SKEW

BACKGROUND OF THE INVENTION

1. Field of The Invention

The present invention relates to an electronic circuit apparatus for providing a stable clock into a semiconductor integrated circuit apparatus such as LSI, IC, etc. or between the apparatuses.

2. Prior Art

Recently, among the electronic circuit apparatuses, more specifically, LSIs, a speeding-up of processing is advanced. Presently, LSI operating at 500 Mhz or more is already published (K. Suzuki et al. ISSCC94, pp.214 to pp.215). It is an important key for the speeding-up to minimize a phase shift in such an LSI and between LSIs, that is, to minimize a clock skew. The clock skew in question will be explained by using FIGS. 1A and 1B. A clock signal is outputted from a clock buffer 60 via an output terminal 61. The clock signal is supplied to a first logic circuit 64 and a second logic circuit 65, and the first logic circuit 64 and the second logic circuit 65 are operated. Supposing that the first logic circuit 64 is located near the clock buffer 60, on one hand, a wire 62 to the second logic circuit 65 is as long as, for example, a distance from one end to the other end of a chip. In this case, compared to a signal 61a received by the first logic circuit 64, a signal 63a received by the second logic circuit 65 is delayed by a wire delay. This signal phase shift Δt is called a clock skew.

As one of methods of reducing the clock skew, heretofore, there is such a method that the wire delay from a clock source to a receiver which each clock is provided to is compensated by a delay circuit generating about as much delay as this wire delay. However, the wire delay is different from the delay of a delay compensation circuit due to a dispersion occurred in a process such as a process of preparing a semiconductor, etc.

That is, for example in the process of preparing a semiconductor apparatus, since there are occurred a resistance dispersion due to the dispersions of the wire width and a film thickness and a wire parasitic capacity dispersion due to the dispersion of insulating films at an upper and a lower of the wire, the wire delay determined by a resistance R and a capacity C is dispersed. While, for example, if the delay circuit comprises series CMOS inverters, this delay is dispersed by a threshold value dispersion due to the dispersions of a gate length of a MOS transistor, an impurity profile, a gate oxide film thickness, etc., a current drive ability dispersion and the like. Since a cause of the delay dispersion of the wire is different from that of the delay dispersion of the delay compensation circuit, both of the delays are not interlocking-varied. Accordingly, even if a delay time is set according to a certain semiconductor apparatus, this delay time is different from the delay time of another prepared semiconductor apparatus. Thereby, since the clock skew is generated, sometimes, a circuit cannot be normally operated.

In such a manner, in conventional semiconductor apparatuses such as LSI, IC, etc., there has been no semiconductor apparatus which is strong relative to a process dispersion, etc., and can stably provide the clock, and can ensure a normal operation of the circuit.

SUMMARY OF THE INVENTION

The present invention is made in view of the above problems. It is an object of the present invention to provide an electronic circuit apparatus which is strong relative to a process dispersion, etc., and can stably provide a clock, and can ensure a normal operation of the circuit.

In order to achieve the above object, according to one aspect of the present invention, there is provided an electronic circuit apparatus having a main system portion and a subsystem portion connected to the main system portion, wherein at least either the main system or the subsystem is provided with a clock source, a clock wire having an outgoing portion and an incoming portion, wherein a clock signal from the clock source is inputted from one end of the outgoing portion, and at least one clock supply means connected to an optional position of the outgoing portion, further connected to a position of the outgoing portion adjacent to the optional position, for supplying a clock signal having an optional delay level relative to the clock signal from the clock source according to a delay level between each clock signal at the positions.

According to a preferred embodiment of the present invention, there is provided an electronic circuit apparatus wherein power source wires Vcc and Vss are disposed parallel to each other at upper and lower portions or at right and left portions of the clock wire.

According to a preferred embodiment of the present invention, there is provided an electronic circuit apparatus wherein the clock signal having a frequency resulted from multiplying the frequency of the clock signal relating to the main system portion or the subsystem portion by n (where, n is a real number more than 1) is provided to the subsystem portion or the main system portion.

In order to achieve the above object, according to another aspect of the present invention, there is provided an electronic circuit apparatus having a main system portion and a subsystem portion connected to the main system portion, wherein at least either the main system or the subsystem is provided with a clock source, clock wires comprising two wires parallel to each other wherein each clock signal from the clock source is inputted from one end of one wire and from the other end of the other wire different from one end corresponding to the one end of the one wire, respectively, and at least one clock supply means connected to an optional position of the one wire, further connected to a position of the other wire adjacent to the optional position, for supplying a clock signal having an optional delay level relative to the clock signal from the clock source according to a delay level between each clock signal at the positions.

According to a preferred embodiment of the present invention, there is provided an electronic circuit apparatus wherein the clock wires are extended at a center portion of the main system portion or the subsystem portion.

According to a preferred embodiment of the present invention, there is provided an electronic circuit apparatus wherein the clock wires are extended at a peripheral portion of the main system portion or the subsystem portion.

According to a preferred embodiment of the present invention, there is provided an electronic circuit apparatus wherein each of the one wire and the other wire of the clock wires comprises two signal lines inputting a complementary signal, respectively.

According to a preferred embodiment of the present invention, there is provided an electronic circuit apparatus wherein the power source wires Vcc and Vss are disposed parallel to each other at the upper and lower portions or at the right and left portions of each of the one wire and the other wire of the clock wires.

According to a preferred embodiment of the present invention, there is provided an electronic circuit apparatus wherein the clock signal having a frequency resulted from multiplying the frequency of the clock signal relating to the main system portion or the subsystem portion by n (where, n is a real number more than 1) is provided to the subsystem portion or the main system portion.

In order to achieve the above object, according to further aspect of the present invention, there is provided an electronic circuit apparatus having a main system portion and a subsystem portion connected to the main system portion, wherein at least either the main system or the subsystem is provided with a clock source, a clock wire sequentially comprising a delaying wire for forming a waveform, an outgoing portion and an incoming portion, wherein the clock signal from the clock source is inputted from one end of the delaying wire, and at least one clock supply means connected to an optional position of the outgoing portion, further connected to a position of the outgoing portion adjacent to the optional position, for supplying a clock signal having an optional delay level relative to the clock signal from the clock source according to a delay level between each clock signal at the positions.

According to a preferred embodiment of the present invention, there is provided an electronic circuit apparatus wherein the outgoing portion and the incoming portion are wired at an equal distance.

According to a preferred embodiment of the present invention, there is provided an electronic circuit apparatus wherein the clock supply means comprises a first input terminal connected to an optional position of the outgoing portion, a second input terminal connected to a position of the outgoing portion physically near the optional position, two series-connected variable control delay circuits having one end connected to the first input terminal or the second input terminal and the other end connected to a phase comparetor, for optionally delaying the clock signal inputted from the first input terminal or the second input terminal, and the phase comparator connected to the second input terminal or the first input terminal, for detecting a phase difference between the clock signal inputted from the second input terminal or the first input terminal and the clock signal delayed by the two variable control delay circuits, for changing the delay level relative to the two variable control delay circuits according to the detected phase difference.

According to a preferred embodiment of the present invention, there is provided an electronic circuit apparatus wherein the phase comparator provides a control signal in such a manner that the phase difference is canceled.

According to a preferred embodiment of the present invention, there is provided an electronic circuit apparatus wherein the delaying wire, the outgoing portion and the incoming portion have each input terminal having a drive buffer, respectively.

According to the preferred embodiment of the present invention, there is provided an electronic circuit apparatus wherein the clock wires are extended at the center portion of the main system portion or the subsystem portion.

According to the preferred embodiment of the present invention, there is provided an electronic circuit apparatus wherein the clock wires comprise two signal lines providing the complementary signal.

According to the preferred embodiment of the present invention, there is provided an electronic circuit apparatus wherein the two signal lines are transposed.

According to a preferred embodiment of the present invention, there is provided an electronic circuit apparatus wherein the power source wires Vcc and Vss are disposed parallel to each other at upper and lower portions or at right and left portions of the clock wires.

According to a preferred embodiment of the present invention, there is provided an electronic circuit apparatus wherein the clock signal having a frequency resulted from multiplying the frequency of the clock signal relating to the main system portion or the subsystem portion by n (where, n is a real number more than 1) is provided to the subsystem portion or the main system portion.

In order to achieve the above object, according to still further aspect of the present invention, there is provided an electronic circuit apparatus comprising: a clock source; a clock wire sequentially comprising a delaying wire for forming a waveform, an outgoing portion and an incoming portion, wherein the clock signal from the clock source is inputted from one end of the delaying wire; and at least one clock supply means connected to an optional position of said outgoing portion, further connected to a position of said outgoing portion adjacent to the optional position, for supplying a clock signal having an optional delay level relative to the clock signal from said clock source according to a delay level between each clock signal at the positions.

According to a preferred embodiment of the present invention, there is provided an electronic circuit apparatus wherein the clock wires comprise two signal lines providing the complementary signal.

According to a preferred embodiment of the present invention, there is provided an electronic circuit apparatus wherein the power source wires Vcc and Vss are disposed parallel to each other at upper and lower portions or at right and left portions of the clock wires.

The nature, principle and utility of the invention will become more apparent from the following detailed description when read in conjunction with the accompanying drawings.

DESCRIPTION OF THE PREFERRED EMBODIMENTS

Embodiments of the present invention will be explained below with reference to the accompanying drawings.

Figure 1A:
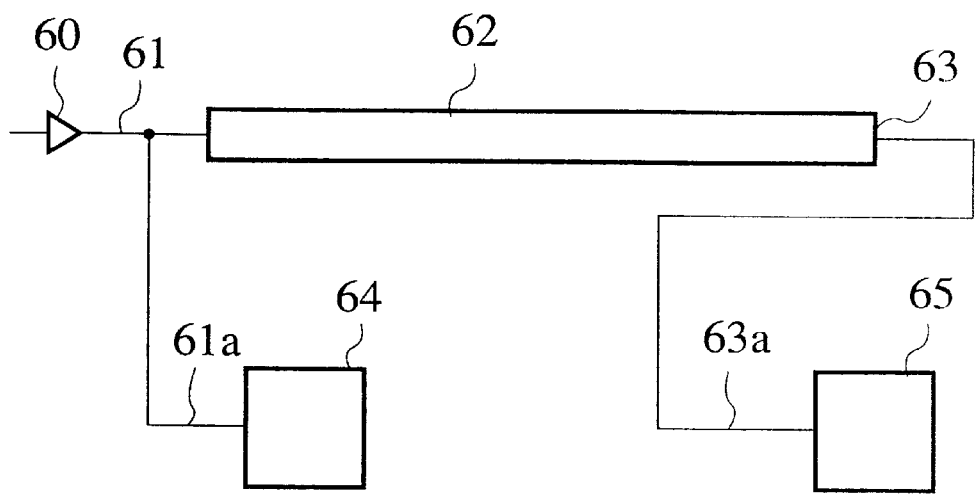
FIG. 1A and 1B show constitution of a conventional electronic circuit apparatus for providing a clock.
Figure 1B:
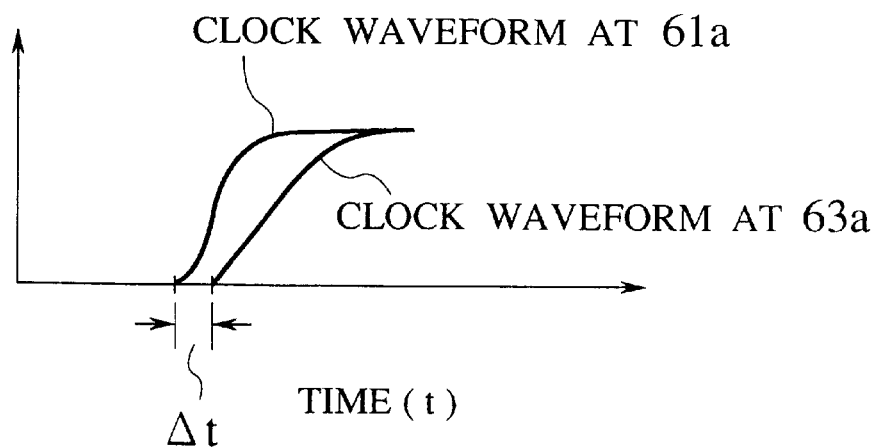
Figure 2:
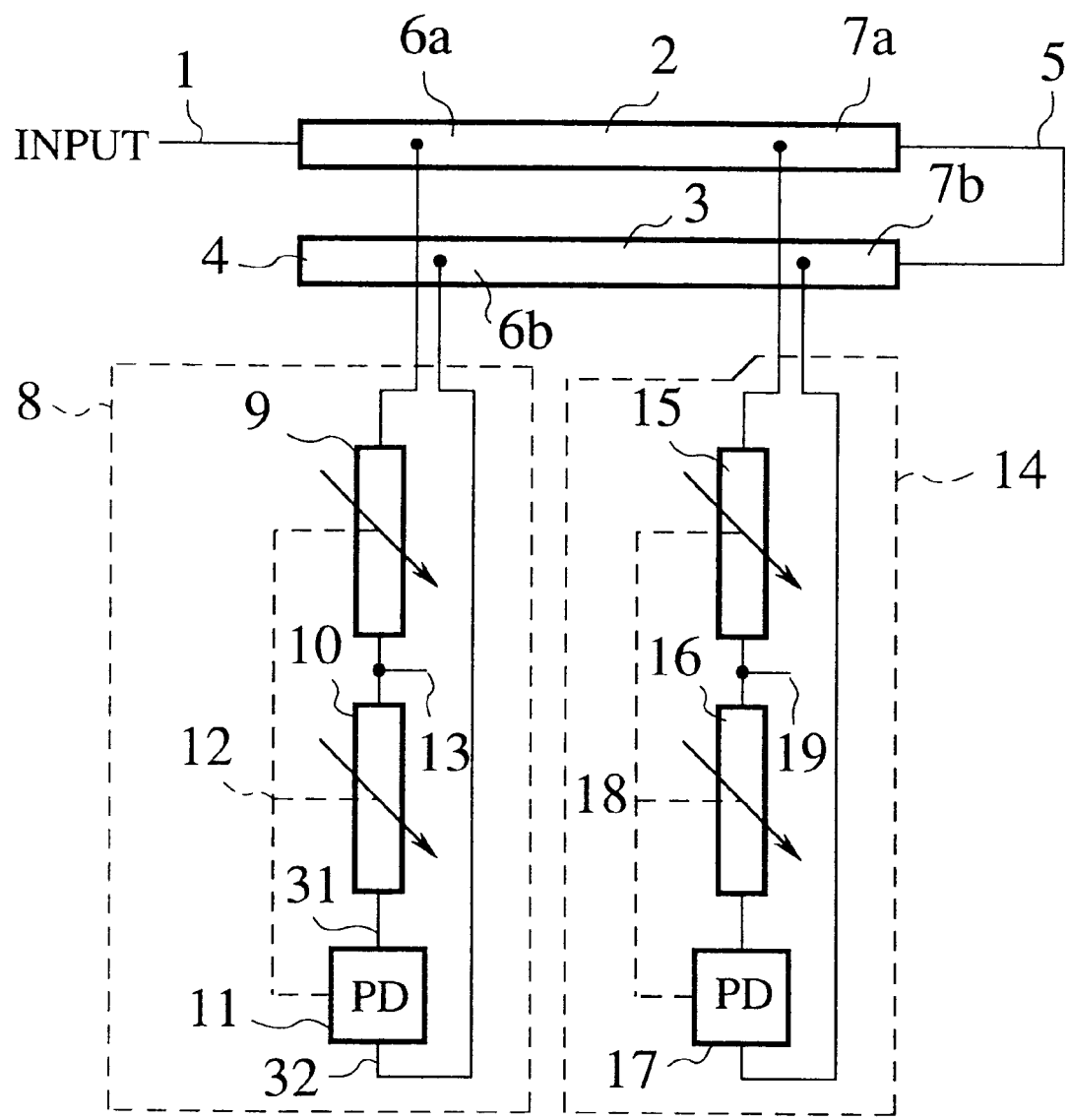
FIG. 2 shows a constitution of an electronic circuit apparatus according to a first embodiment of the present invention.

FIG. 2 shows a schematic constitution according to a first embodiment of the present invention. A numeral 1 denotes an input terminal of a clock signal. Numerals 2 and 3 denote wires for transmitting the clock signal. More specifically, the numeral 2 denotes an outgoing portion, which corresponds to the portion where the clock signal propagates away form the input terminal, portion and the numeral 3 denotes an incoming portion, which corresponds to the portion where the clock signal propagates back toward the input terminal. A numeral 4 denotes a terminal. A numeral 5 denotes a turning point corresponding to a middle point of the wire. A numeral 6a denotes a first input terminal of a first receiver 8, and the first input terminal 6a is characterized by being connected to the outgoing wire 2. A numeral 6b denotes a second input terminal of the first receiver 8, and the second input terminal 6b is characterized by being connected to the incoming wire 3 physically near the first input terminal 6a. A numeral 7a denotes a first input terminal of a second receiver 14, and the first input terminal 7a is characterized by being connected to the outgoing portion 2. A numeral 7b denotes a second input terminal of the second receiver 14, and the second input terminal 7b is characterized by being connected to the incoming portion 3 physically near the first input terminal 7a. The first receiver 8 comprises a phase comparator 11 and a set of series-connected two variable control delay circuits 9, 10. The second receiver 14 comprises a phase comparator 17 and a set of two series-connected two variable control delay circuits 15, 16.

Figure 3:
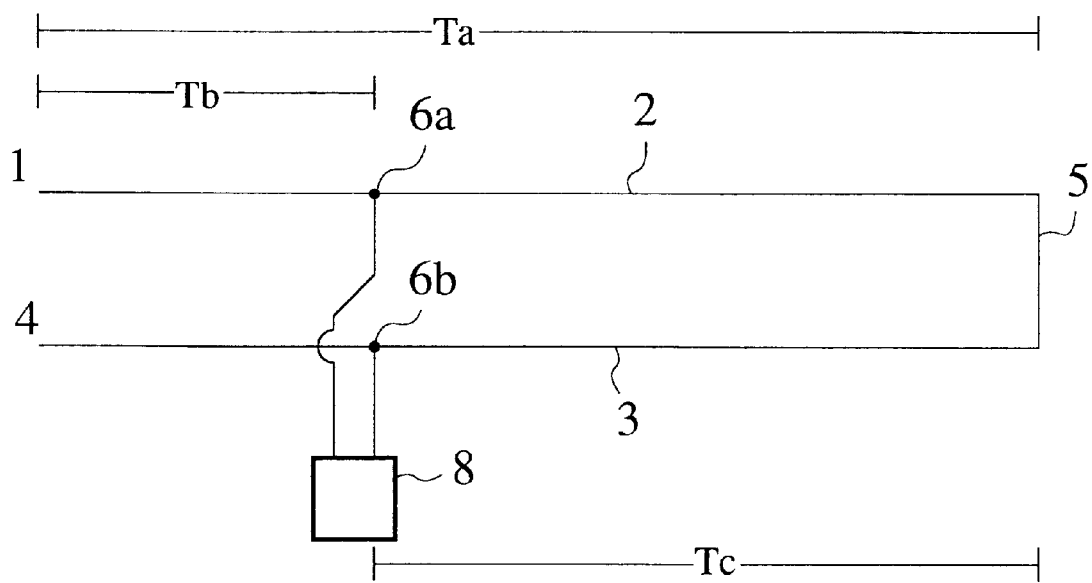
FIG. 3 is a timing chart showing a timing of the clock.

Next, a state of each signal at the signal input terminals 6a, 6b will be explained by using FIG. 3. Here, Ta denotes a delay time from the input terminal 1 to the turning point 5 of the clock, and Tb denotes the delay time from the input terminal 1 to the first input terminal 6a of the receiver Accordingly, the signal at the first input terminal 6a is delayed Tb behind the clock input. Furthermore, at the second input terminal 6b, the delay time from the turning point 5 to the terminal 4 is equal to a time Ta from the input terminal 1 to the turning point 5. The delay time from the second input terminal 6b to the terminal 4 is equal to the time Tb, since the second input terminal 6b is physically near to the first input terminal 6a. Accordingly, the delay at the second input terminal 6b is 2×Ta−Tb. The delay at the first input terminal 6a is Tb. The delay at the second input terminal 6b is 2×Ta−Tb.

Accordingly, an average value between the delay times at the first input terminal 6a and the second input terminal 6b is (2×Ta−Tb+Tb)/2=Ta. The average value does not depend on a position of Tb. That is, the average value is a constant value independently of the position of the input terminal. In short, if two input terminals can be physically located near each other in respective outgoing and incoming portions, a substantially constant-held phase signal can be sampled from any place on the clock wires 2, 3. This means that the same phase signal can be synthesized anywhere on a chip.

Figure 4A:
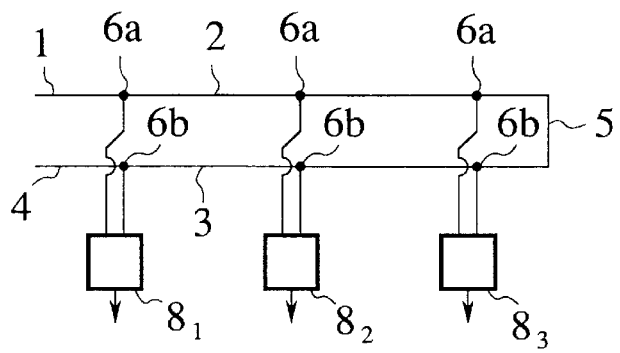
FIGS. 4A to 4D shows various examples as to how to arrange an input terminal.
Figure 4B:
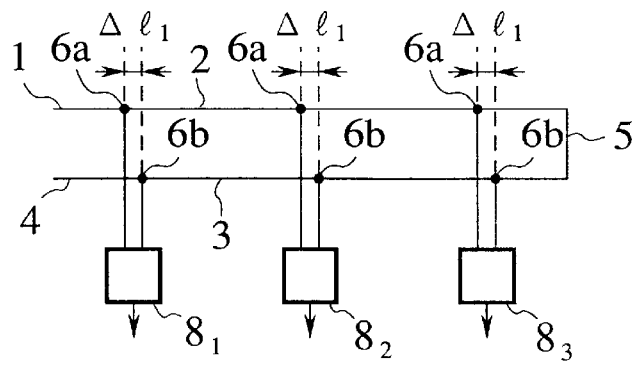
Figure 4C:
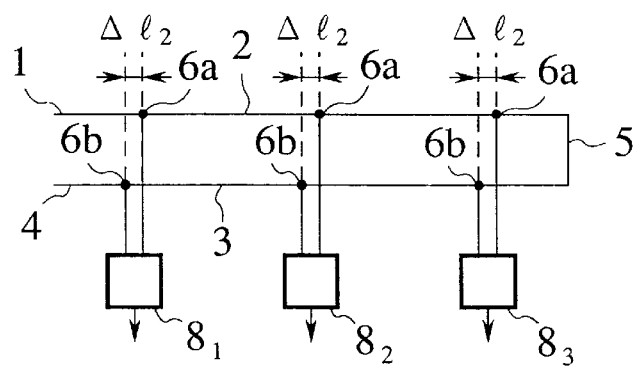

Here, modified examples of arranging the input terminals located physically near each other according to the present invention will be explained with reference to FIGS. 4A to 4D. When the semiconductor apparatus such as LSI, etc. is actually applied to the electronic circuit apparatus, as shown in FIGS. 4A to 4D, it is assumed that a plurality of logic circuits (not shown) are connected to the clock wires 2, 3 via receivers $8_1$, $8_2$, $8_3$. FIGS. 4A to 4D show a relative location of clock wire portions 2 and 3 as they would be arranged on an LSI chip or circuit board. In this case, as shown in FIG. 4A, the input terminals 6a, 6b to the receivers $8_1$, $8_2$, $8_3$ may be located on a straight line transverse to the clock wires 2, 3. As shown in FIGS. 4B and 4C, the input terminals 6a, 6b may be as a whole shifted at $\Delta 1_1$, $\Delta 1_2$ either rightward or leftward. When the input terminals 6a, 6b are located as shown in FIGS. 4B and 4C, a wire layout from the clock wires 2, 3 to the receivers $8_1$, $8_2$, $8_3$ is easy.

Figure 4D:
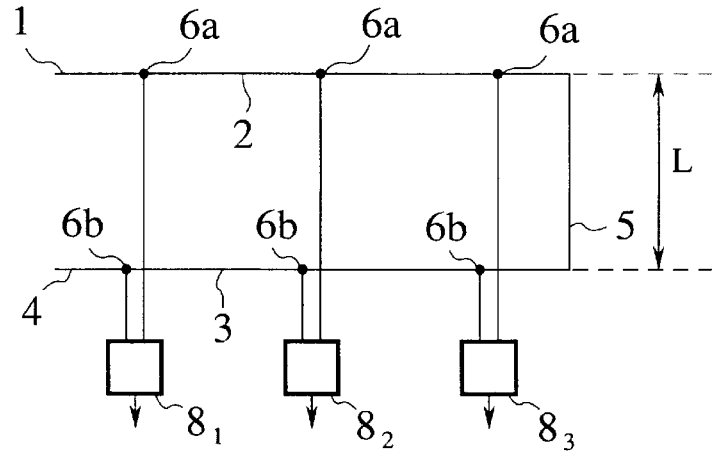

Furthermore, as shown in FIG. 4D, the turning point 5 may be not necessarily a point. There may be a distance L between the outgoing portion 2 and the incoming portion 3. The important is that the clock phases or an average clock delay at the first input terminal 6a and the second input terminal 6b is substantially constant anywhere on the clock wire. Here, the physically near location satisfies such a locational relationship.

In FIG. 4D, the distance L is intentionally increased, thereby the receiver and the logic circuit may be arranged in a region surrounded by the clock wires 2 and 3.

Moreover, as further modified example, when the clock signal whose phase is shifted from others is provided to a particular logic circuit among a plurality of logic circuits, the input terminal of the particular logic circuit may be located differently from other input terminals.

Next, a circuit for averaging the above delay time will be explained.

As shown in FIG. 2, the first input terminal 6a is connected to a variable delay circuit 9. Furthermore, a variable delay circuit 12 is series-connected to the variable delay circuit 9. A sum of the delays of the variable delay circuits 9, 12 is compared to the phase of a wire-delayed signal at the second input terminal by the phase comparator 11. The delays of the variable delay circuits 9, 12 is adjusted in such a manner that the phases match to each other. When the delay times of the variable delay circuits 9, 12 are equally set, an output 13 of the variable delay circuit 9 can obtain an output having an average delay time of the delay times of the first and second input terminals 6a, 6b. Next, the example of the phase comparator and the variable delay circuit will be shown.

Figure 5:
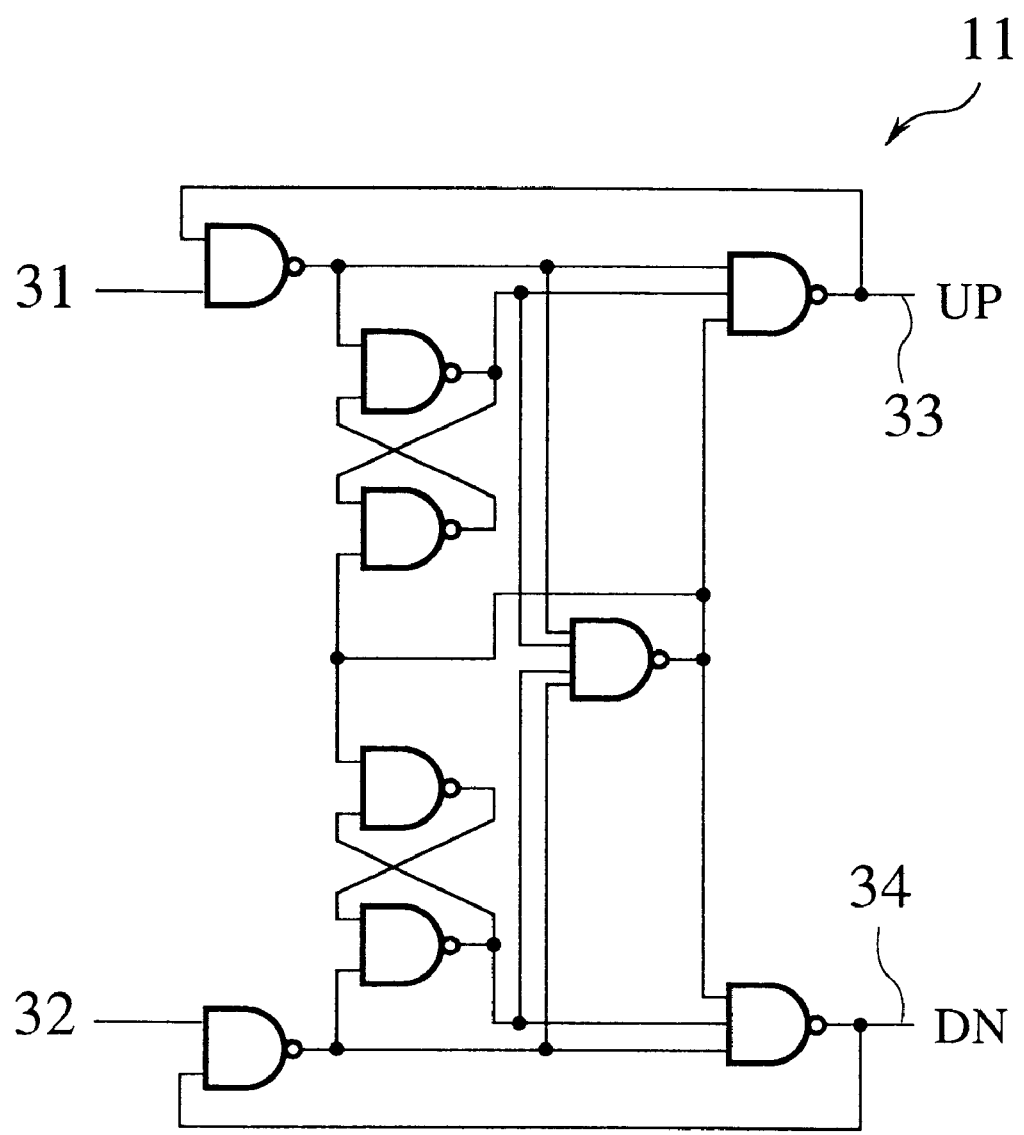
FIG. 5 shows a constitution example of a phase converter.

FIG. 5 shows the phase comparator. From when both of an input 31 and an input 32 are in state of H level, when it is detected that one input is transited to L level, a phase comparison is started. When a signal 32 is priorly trailed, a signal 34 becomes active. When a signal 31 is priorly trailed, a signal 33 becomes active. Furthermore, a period until the other signal is trailed is detected as the phase difference.

Figure 6A:
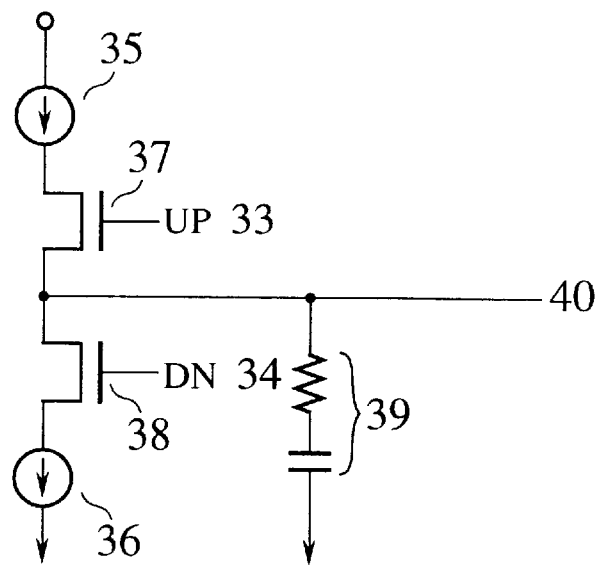
FIGS. 6A and 6B show constitution examples of a variable delay circuit.
Figure 6B:
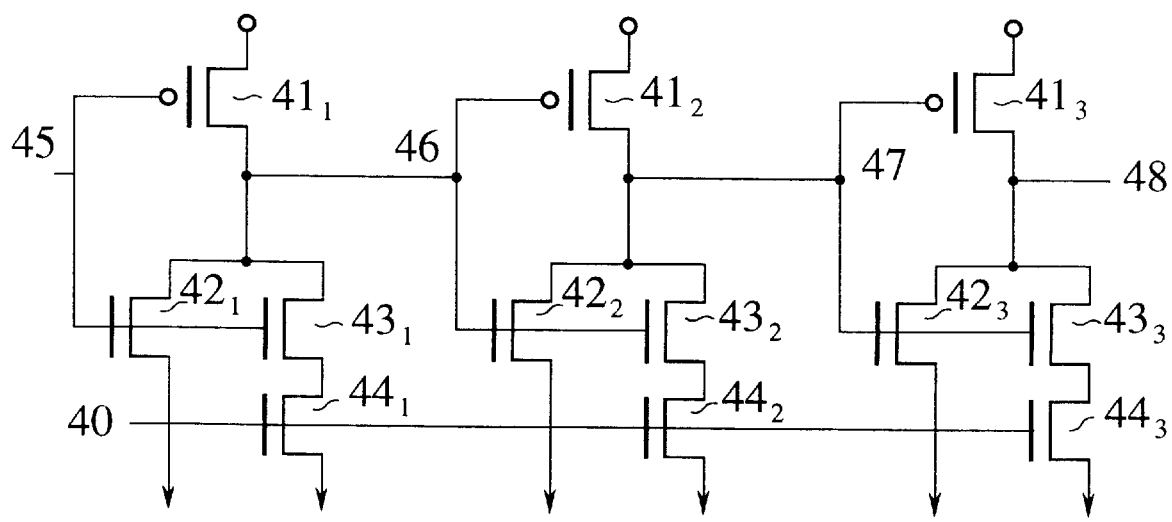

FIGS. 6A and 6B show an example of the variable delay circuit. When the signal is delayed according to the output from the phase comparator, an electric potential generating circuit switch 37 for the variable delay circuit shown in FIG. 6A is conducted by the output signal 33 from the phase comparator. Thereby, the electric potential of an output node (current modulating input) 40 is raised. Since a current drive ability of transistors $44_1$, $44_2$, $44_3$ of a variable delay circuit delay portion shown in FIG. 6B is increased, the delay time is reduced. On the contrary, when the signal is earlier, an electric potential generating circuit switch 38 for the variable delay circuit shown in FIG. 6A is conducted by the output signal 34 from the phase comparator. Thereby, the electric potential of the output node 40 is fallen. Since the current drive ability of the transistors $44_1$, $44_2$, $44_3$ of the variable delay circuit delay portion shown in FIG. 6B is reduced, the delay time is increased.

As described above, the phases are compared to each other, thereby the phases can be matched to each other.

In FIG. 6A, numerals 35 and 36 denote first and second power sources, respectively. A numeral 39 denotes a low path filter. In FIG. 6B, a numeral 40 denotes a current modulating input. Numerals $41_1$, $41_2$, $41_3$ denote PMOS loads of each inverter, respectively. Numerals $42_1$, $42_2$, $42_3$ denote nMOS drivers of each inverter, respectively. Numerals $44_1$, $44_2$, $44_3$ denote variable power sources of each inverter, respectively. A numeral 45 denotes a first inverter input. A numeral 46 denotes a first inverter output. A numeral 47 denotes a second inverter output. A numeral 48 denotes a third inverter output.

Figure 7:
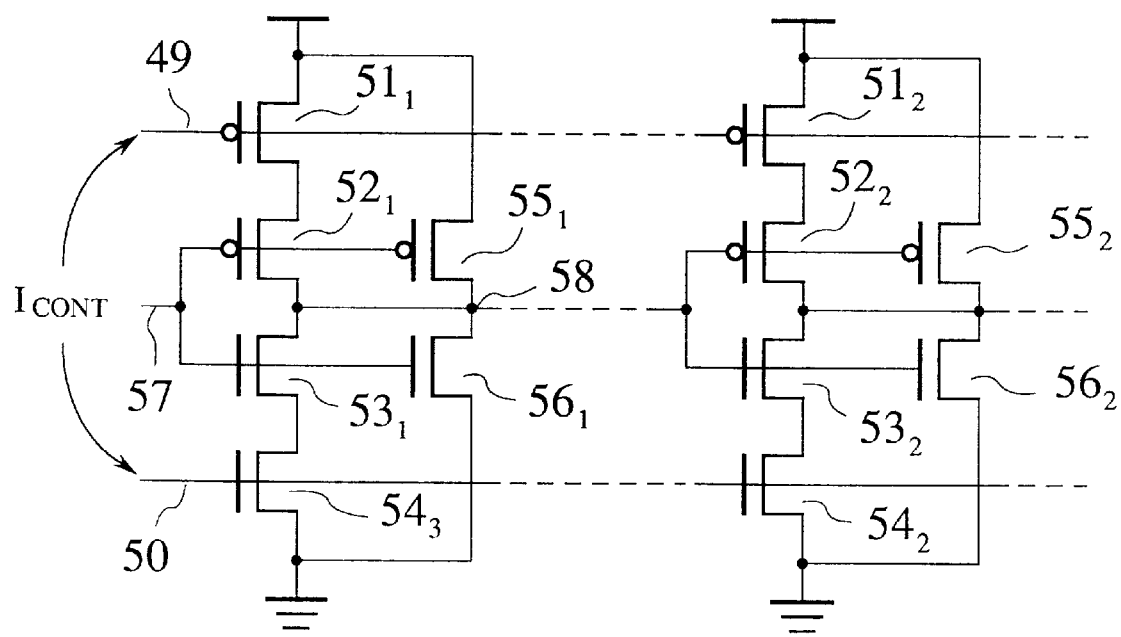
FIG. 7 shows a constitution of a delay portion of the variable delay circuit.

Furthermore, in FIGS. 5, 6A and 6B, although only an NMOS is controlled, the variable delay circuit delay portion can be complementarily constructed. FIG. 7 shows a complementarily constructed variable delay circuit delay portion.

Figure 8:
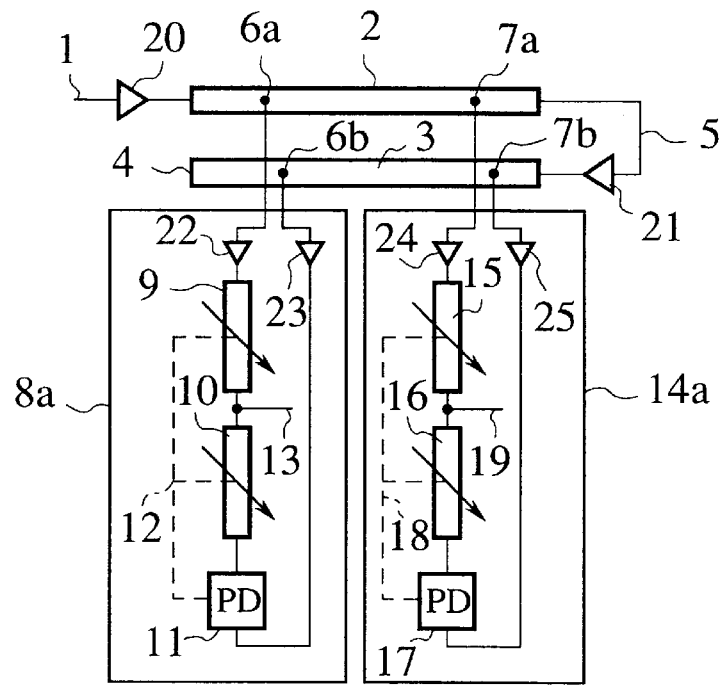
FIG. 8 shows a constitution of an electronic circuit apparatus according to a second embodiment of the present invention.

Next, FIG. 8 shows a schematic constitution according to a second embodiment. The difference between the first and second embodiments is that the second embodiment comprises a buffer 20 for driving the outgoing portion and a buffer 21 for driving the incoming portion. Here, a buffer circuit means a plurality of series-connected usual CMOS inverters, a current mirror type actuating amplifier and the like. Similarly to the first embodiment, the constitution according to the second embodiment is designed so that the delay of the outgoing portion (exactly, a buffer delay plus the wire delay) may be equal to the delay of the incoming portion (exactly, the buffer delay plus the wire delay). Compared to the first embodiment, when more especially long wire is used, thereby there is occurred such a problem that a transmitted waveform is deteriorated, the constitution of the second embodiment is preferable. Furthermore, in order to reduce a capacity of the input terminals of the receivers 8 and 14, the constitution is provided with a buffer 22 and a buffer 24. Furthermore, in order to match the phases, an input portion of the phase comparator is also provided with a buffer 23 and a buffer 25. Other constitution is similar to the constitution of the first embodiment shown in FIG. 2.

Figure 9:
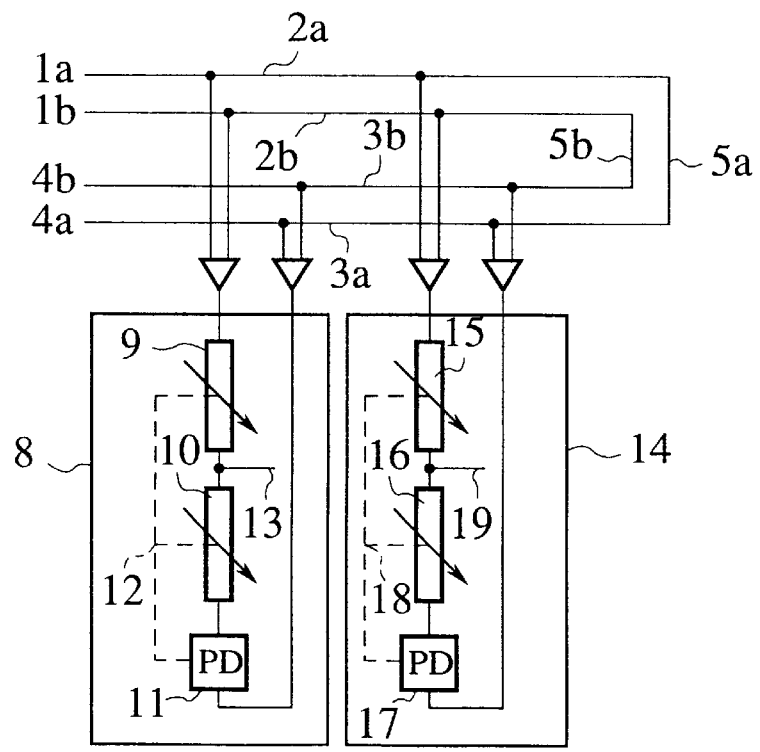
FIG. 9 shows a constitution of an electronic circuit apparatus according to a third embodiment of the present invention.

Next, FIG. 9 shows a schematic constitution of a third embodiment. The difference between the first and third embodiments is that the clock is wire-provided by the complementary signal. In this case, similarly, a set of wires 2a, 2b, 3a, 3b having outgoing and incoming portions are wired. The phase difference between the outgoing portions 2a, 2b and the incoming portions 3a, 3b is detected, thereby independently of the position of the wires, the clock can be generated. If respective two wires of the outgoing portions 2a, 2b and the incoming portions 3a, 3b are transposed each other, a resistance to noise is enhanced.

Figure 10:
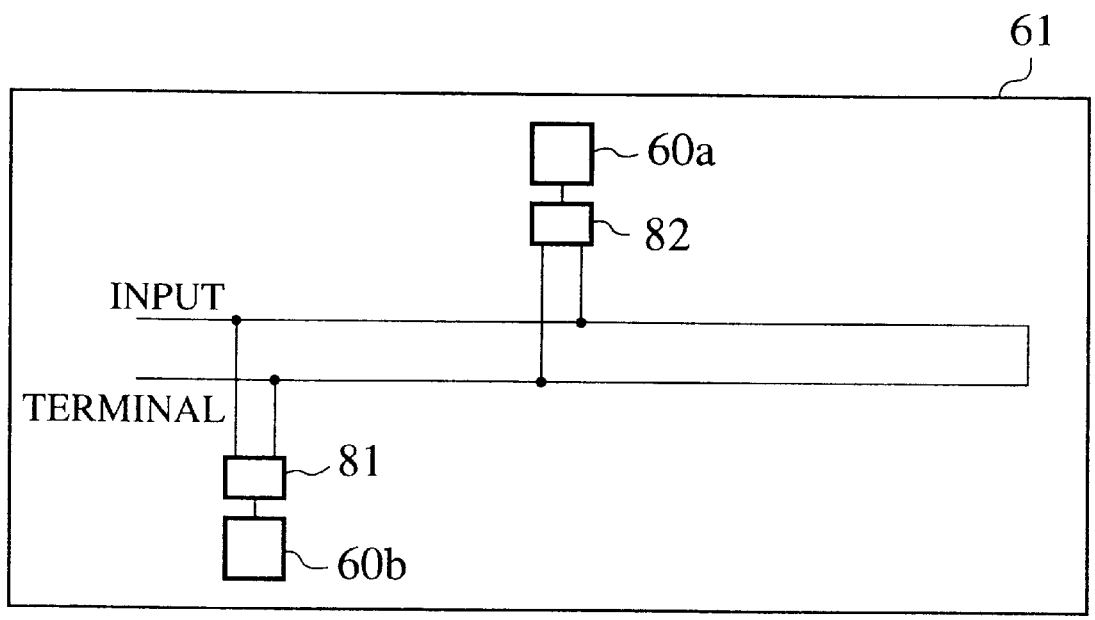
FIG. 10 shows a preferable usage example of the present invention.

Next, FIG. 10 shows a preferable usage example of the present invention. The outgoing and incoming wire portions (or the outgoing and incoming wire portions, and the buffer) are arranged at the center portion of a semiconductor chip 61. Logic circuits 60a, 60b whose phases are desired to match to one another and receivers 81, 82 are defined as one set, and a plurality of sets are arranged in the chip. The wires are arranged at the center portion of the chip, thereby the arrangement can be realized so that a substantial uniform clock may be easily provided all over the chip. Furthermore, according to the example shown in FIG. 10, although the clock input is arranged at an end portion of the chip, the center portion of the chip is defined as a starting point, and the wires may be arranged at the right and left portions of the chip from the starting point.

Figure 11A:
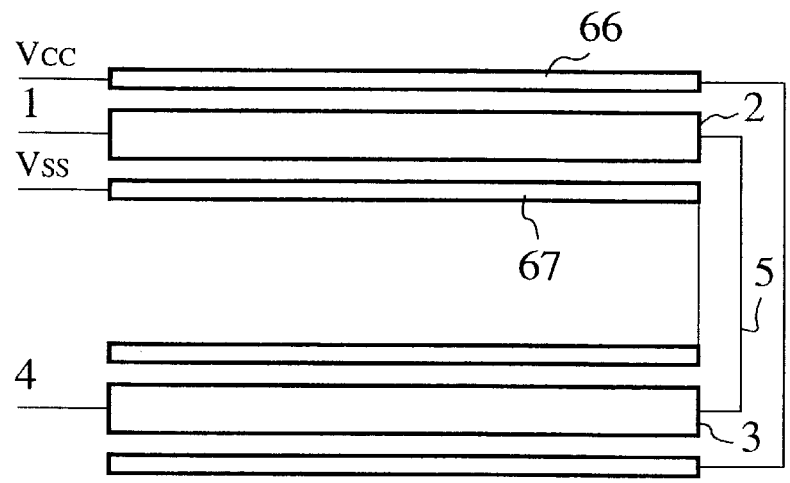
FIG. 11A to 11C shows a mode suppressing an influence of a noise upon a clock wire.
Figure 11B:
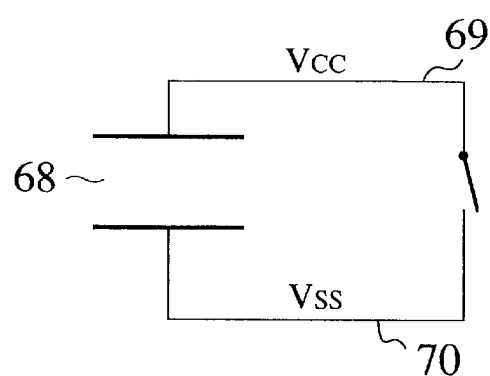
Figure 11C:
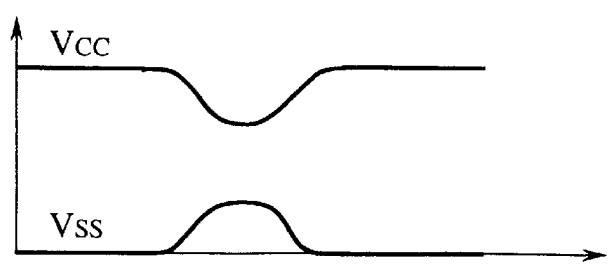

FIG. 11A to 11C shows a mode suppressing an influence of a noise upon the clock wire. In order to reduce the noise applied to the clock wire portions 2 and 3 due to a combination of capacity by adjacent wires, the power source wires such as Vcc 66 or Vss 67 are arranged parallel to each other. The clock wire portions 2 and 3 and power source wires Vcc 66 and Vss 77 are shown as they would be arranged on an LSI chip or circuit board. The power source wire is different from a general signal line, and it serves as a shield for preventing an amplitude. More specifically, in case of LSI chip, when the current is passed from a Vcc wire to a Vss wire, the electric potential of the Vcc wire is reduced. While, the electric potential of the Vss wire which the charge is flowed into is increased. That is, in the LSI chip, the Vcc wire and the Vss wire are changed in the direction opposite to each other (one is fallen, the other is raised) at the same timing. Accordingly, one shield of the clock wire is Vcc, and the other shield is Vss. The Vcc and Vss have as much capacity combination as the clock wires, thereby the noise due to the capacity combination is reduced or canceled. Although the mode on a plane surface (at the right and left) is described above, the shields may be arranged an the upper and lower portions or at the upper and lower portions and the right and left portions. Furthermore, the Vcc and Vss wires are located near the input terminal 1, thereby since the wire delay of the Vcc 66 and the Vss 67 is same as that of the clock wire portions 2 and 3, the noise also passes through the Vcc 66 and the Vss 67 according to the transmitted clock. Accordingly, since any receiver at any position on the wire can be similarly influenced, more preferably, it is not necessary to optimally design according to places. Furthermore, naturally, this mode can be applied to each of the above embodiments.

According to the schematic constitution of the outgoing and incoming clock wire portions being a premise of the first embodiment described above, the wire delay from the clock source to the receivers which each clock is supplied to can be compensated. However, in this method, it is necessary that the wire delays or the phase shifts of the outgoing and incoming portions are equal. Strictly speaking, since the signal of the outgoing portion is transmitted to the incoming portion, compared to the waveform of the input signal of the outgoing portion, the waveform of the input signal of the incoming portion is distorted. As a result, sometimes, it is difficult to adjust the phase.

Figure 12:
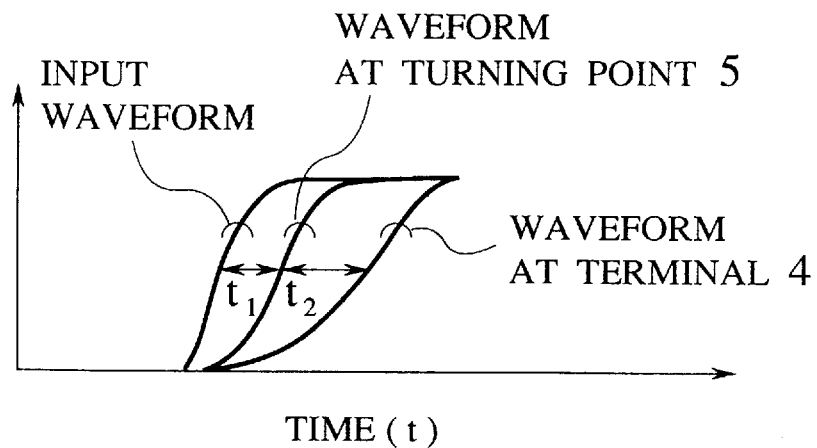
FIG. 12 shows defects of the first, second and third embodiments.

That is, as shown in FIG. 12, even if the same drive buffers 20, 21 and the same clock wire portions 2, 3 are used in the constitution shown in FIG. 8, the input waveform of the buffer 20 is sharp-shaped, similarly to a usual clock. On one hand, the input waveform of the buffer 21 of the incoming portion is rounded-shaped. That is, since different input waveforms are inputted to the same constitution, the outputs are different. As shown in FIG. 12, there is possibility that the delay from the input 1 to the turning point 5 is different from the delay from the turning point 5 to the terminal 4. When the difference between the delays is large, the receiver which is operated after detecting the phases of the outgoing and incoming portions cannot normally output. In the worst case, an operation phase of the logic circuit is shifted, thereby there is occurred such a problem that the receiver is operated in error.

In order to solve such a problem, the constitution according to a fourth embodiment of the present invention described below can be adopted.

Figure 13:
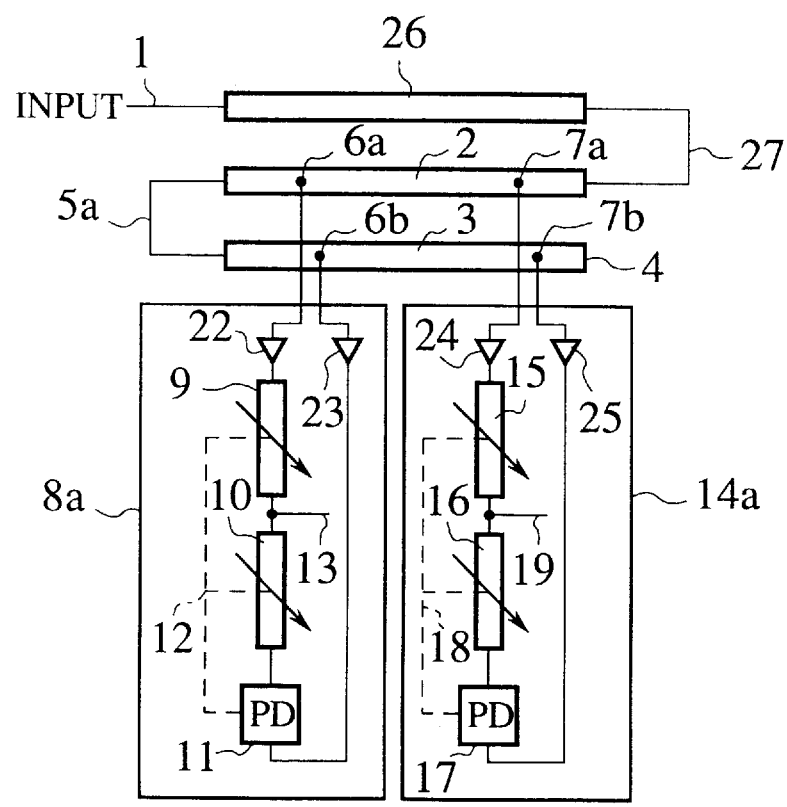
FIG. 13 shows a constitution of an electronic circuit apparatus according to a fourth embodiment of the present invention.

FIG. 13 shows a schematic constitution according to the fourth embodiment of the present invention.

A numeral 1 denotes the input terminal of the clock signal. Numerals 26, 2, 3 denote the clock wires for transmitting the clock signal. More specifically, a numeral 26 denotes the delaying wire, the numeral 2 denotes the outgoing portion, and the numeral 3 denotes the incoming portion. A numeral 4 denotes the terminal. A numeral 27 denotes a first turning point. A numeral 5a denotes a second turning point. A numeral 6a denotes a first input terminal of a first receiver 8a, and the first input terminal 6a is characterized by being connected to the outgoing portion 2. A numeral 6b denotes a second input terminal of the first receiver 8a, and the second input terminal 6b is characterized by being connected to the incoming portion 3 physically near the first input terminal 6a.

The receiver 8a comprises the phase comparator 11 and a set of variable control delay circuits 9, 10. A receiver 14a comprises a phase comparator 17 and a set of variable control delay circuits 15, 16. Since the phase comparator 11, 17 and the variable control delay circuits 9, 10, 15, 16 are may be constructed similarly to the constitution explained in FIGS. 2, 8 and 9, a detailed explanation is omitted.

Figure 14:
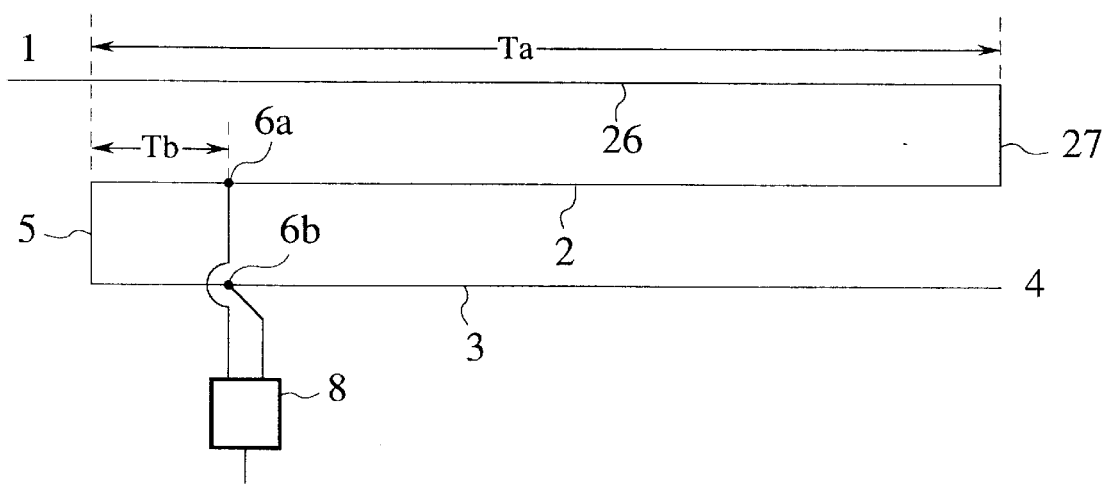
FIG. 14 is a timing chart showing a timing of the clock.

Next, a state of each signal at the signal input terminals 6a, 6b will be explained by using FIG. 14. Here, Ta denotes the delay time from the input to the first turning point, and Tb denotes the delay time from the second turning point to the first input terminal of the receiver. Accordingly, the signal at the input terminal 6a is delayed 2×Ta–Tb, and the signal at the input terminal 6b is delayed 2×Ta+Tb.

The delay at the input terminal 6a is 2×Ta–Tb.

The delay at the input terminal 6b is 2×Ta+Tb.

Accordingly, the average value between the delay times at the input terminals 6a and 6b is (2×Ta–Tb +2×Ta+Tb)/2= 2×Ta. The average value does not depend on the position of Tb, and the average value is the constant value. This means that the same phase signal can be synthesized anywhere on the chip.

The fourth embodiment is characterized by that the waveform formed by the delaying wire 26 is inputted to the outgoing portion 2, and the output whose waveform is formed by the outgoing portion 2 having the same characteristic as the delaying wire 26 is inputted to the incoming portion 3. That is, since the delays of the outgoing portion 2 and the incoming portion 3 are equally inputted via the delaying wire 26, the delays having the same waveform or the substantially same waveform are inputted. Accordingly, the output delay can become equal.

Here, according to the fourth embodiment, basically, the delaying wire 26 having no information relating to the position only forms the waveform. Accordingly, for example, as the modified example, the wires are lain in a zigzag line so that the wires have the same length, thereby the modification can be realized. Note that it is the fourth embodiment which is strong relative to the process dispersion due to a local variation of the insulating film between layers, etc.

Figure 15:
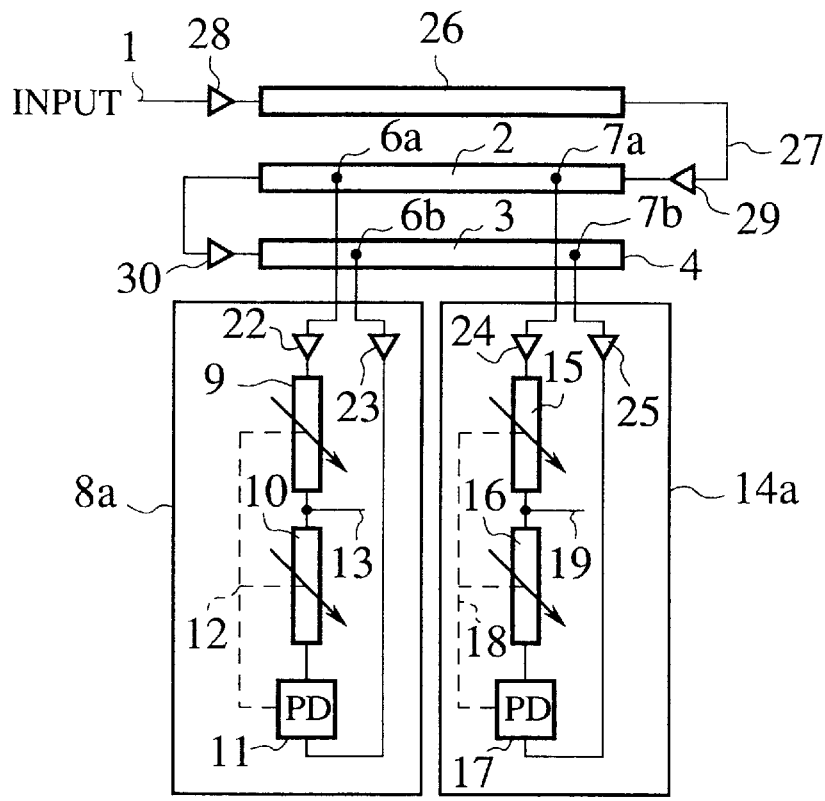
FIG. 15 shows a constitution of an electronic circuit apparatus according to a fifth embodiment of the present invention.

Next, FIG. 15 shows a fifth embodiment of the present invention. The difference between the fourth and fifth embodiments is that the fifth embodiment is provided with a buffer 28 driving the delaying wire 26, a buffer 29 driving the outgoing portion 2 and a buffer 30 driving the incoming path 3. Here, the buffer circuit means a plurality of series-connected usual CMOS inverters, the current mirror type actuating amplifier and the like. Similarly to the fourth embodiment, the constitution of the fifth embodiment is designed so that the delay of the outgoing portion (exactly, the buffer delay plus the wire delay) may be equal to the delay of the incoming portion (exactly, the buffer delay plus the wire delay). Compared to the fourth embodiment, when more especially long wire is used, thereby there is occurred such a problem that the transmitted waveform is deteriorated, the constitution of the fifth embodiment is preferable.

According to the fifth embodiment, basically, the delaying wire 26 having no information relating to the position only forms the waveform. Accordingly, for example, the wires are lain in a zigzag line so that the wires have the same length, thereby the deformation can be realized. Note that it is the fifth embodiment which is strong relative to the process dispersion due to the local variation of the insulating film between layers, etc.

Figure 16:
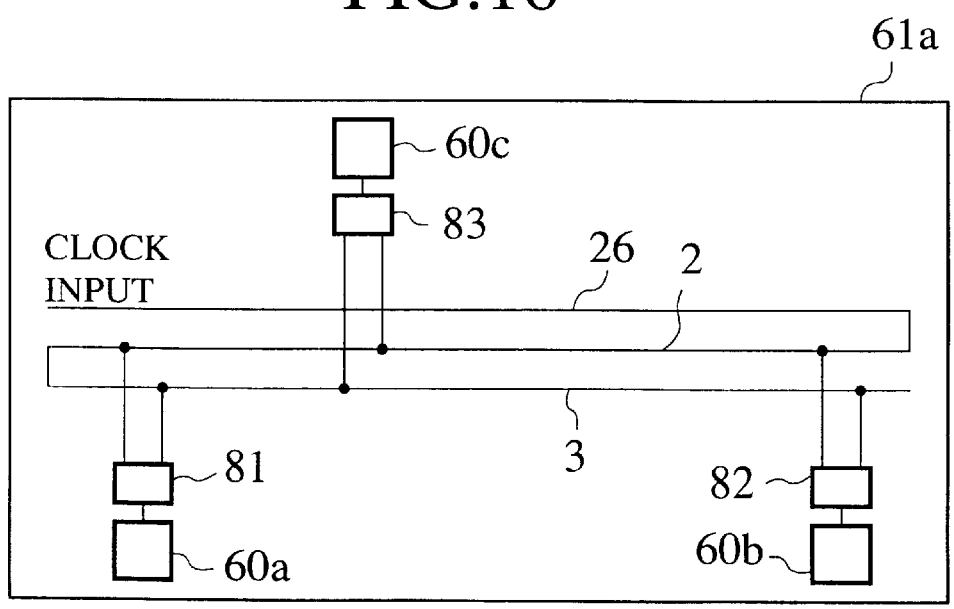
FIG. 16 shows a preferable usage example of the present invention.

Next, FIG. 16 shows a preferable usage example of the present invention. One and half outgoing and incoming portion (or one and half outgoing and incoming portion, and the buffers) are arranged at the substantially center portion of a semiconductor chip 61a. The logic circuits 60a, 60b, 60c whose phases are desired to match to one another and the receivers 81, 82, 83 are defined as one set, and a plurality of sets are arranged in the chip 61a. The wires are arranged at the center portion of the chip, thereby the arrangement can be realized so that a substantial uniform clock may be easily provided all over the chip. Furthermore, according to the usage example shown in FIG. 16, although the clock input is arranged at the end portion of the chip, the center portion of the chip is defined as the starting point, and the wires may be arranged at the right and left portions of the chip from the starting point. Furthermore, the present invention can be applied to not only the semiconductor chip, but also a board mounting a plurality of LSI chips described below.

Figure 17:
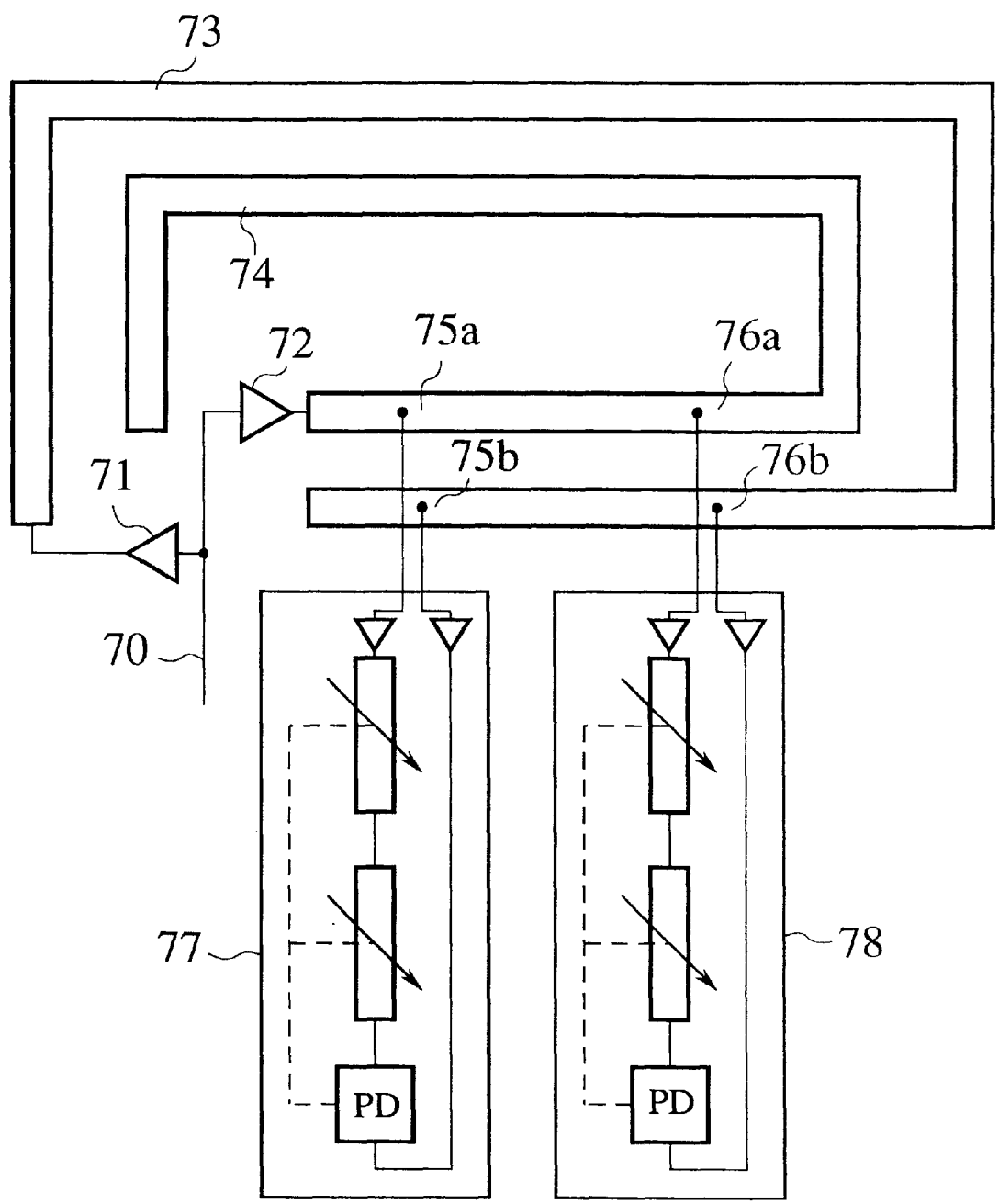
FIG. 17 shows a constitution of an electronic circuit apparatus according to a sixth embodiment of the present invention.

FIG. 17 shows a sixth embodiment of the present invention. The sixth embodiment is largely different from the above embodiments. Basically, the above embodiments are constructed so that the outgoing and incoming portion is provided with the input portion for forming the waveform. However, according to the sixth embodiment, two wires 73, 74 having the substantially same width are arranged in a clockwise direction and a counterclockwise direction from a clock source 70 at one position on a substrate such as the chip, etc., respectively. Thereby, the sharp waveform can be provided to buffers 71, 72 driving both of the wires 73, 74. Differently from the above embodiments, it is not necessary to form the waveform. Furthermore, the delay of one-round wire is defined as To, and the delay from the buffer portion 71 of the clockwise wire 73 to the receiver input portion 75a is defined as Td. In this case, since the delay from the buffer 72 to a receiver input portion 75b is estimated at Tc–Td. Accordingly, the delay at the receiver input portion 75a is Td, and the delay at the receiver input portion 75b is Tc–Td. The values Td and Tc–Td are averaged, thereby the clock which does not depend on the position can be obtained. Receivers 77, 78 may be constructed similarly to the constitution of the receivers shown in FIG. 2.

Figure 18:
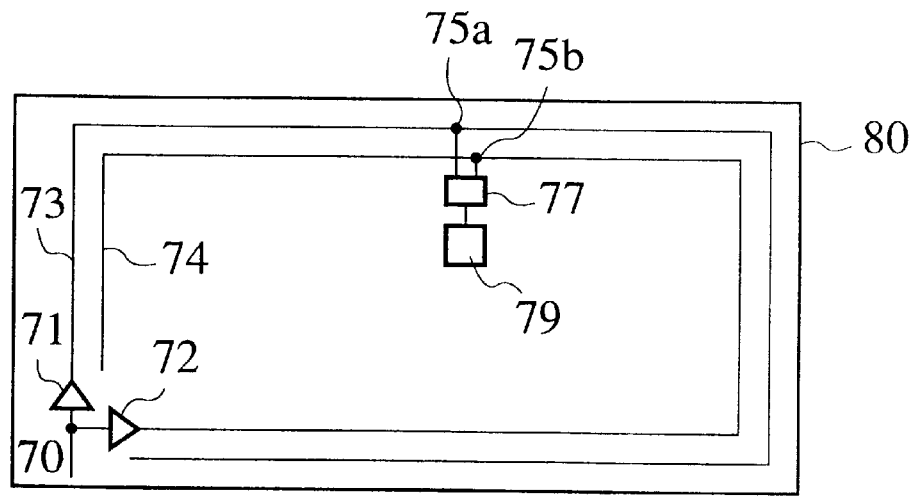
FIG. 18 shows a constitution of an electronic circuit apparatus according to a seventh embodiment of the present invention.

FIG. 18 shows a seventh embodiment of the present invention. The constitution according to the sixth embodiment is arranged on an outer periphery on LSI chip 80. Thereby, the phase can be matched to each other, independently of the position on the chip. The clock having no phase difference can be provided to a circuit 79 such as a plurality of logic circuits, etc.

Figure 19:
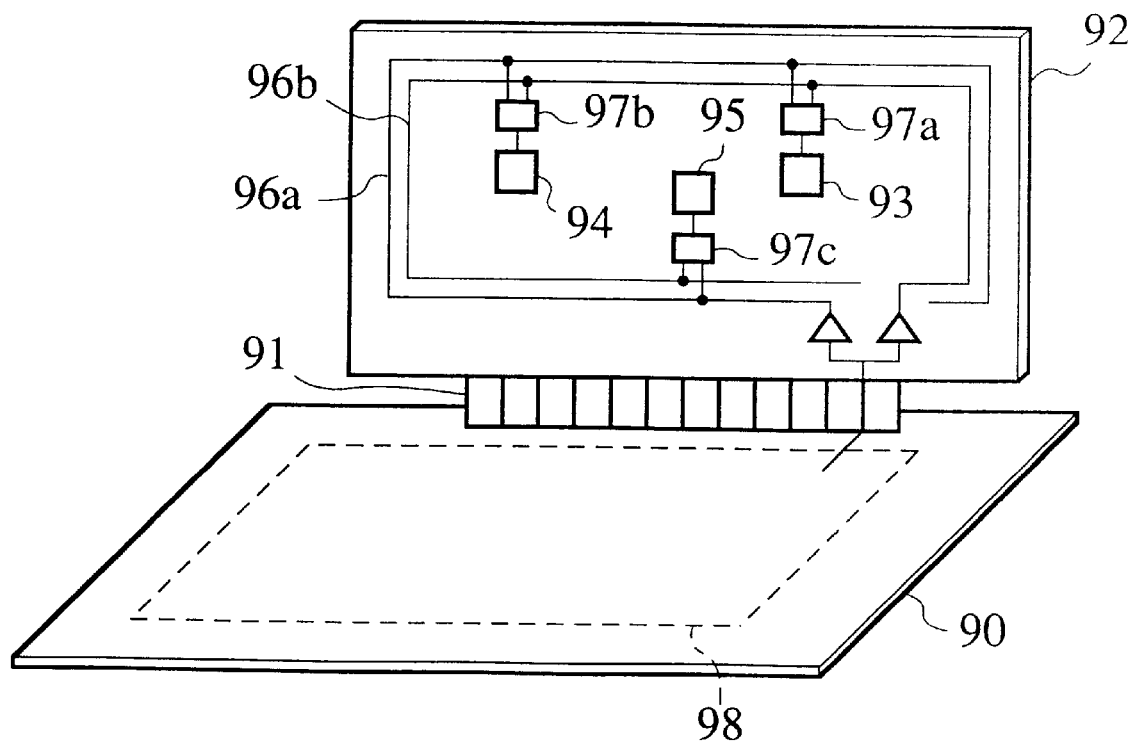
FIG. 19 shows a constitution of an electronic circuit apparatus according to an eighth embodiment of the present invention.

FIG. 19 shows an eighth embodiment of the present invention. According to the eighth embodiment, an electronic circuit apparatus comprises a main system portion 90 and a subsystem portion 92 connected to the main system portion 90 via a coupling portion 91. According to the eighth embodiment, a main memory 93, a cache memory 94 and a logic circuit 95 are mounted to the subsystem portion 92. As the seventh embodiment shown in FIG. 18, the main memory 93, the cache memory 94 and the logic circuit 95 are connected to two clock wires 96a, 96b arranged in two direction (in the clockwise and counterclockwise directions) from the clock source at one position via receivers 97a, 97b, 97c.

According to such a constitution, a stable clock can be provided to each integrated circuit apparatus among the integrated circuit apparatuses having different function, respectively.

Furthermore, in this case, as shown in FIG. 19, all of the receivers 97a, 97b, 97c, the main memory 93, etc. are arranged at an inner side relative to the clock wires 96a, 96b, thereby there is such an advantage that the layout can become easy.

According to the eighth embodiment, although such an example that the present invention is applied to the subsystem portion is shown, in FIG. 19, the present invention may alternatively be applied to the main system portion 90. And also, the present invention may be applied to both the main system portion 90 and the subsystem portion 92.

The main system portion 90 includes, for example, an electronic circuit group 98 for achieving a predetermined function such as a communication equipment, an image equipment, a memory equipment, and the like.

Furthermore, in FIG. 19, although the clock is inputted to all the logic circuits and the memories, the clock may be selectively inputted to one part of the logic circuits and the memories.

Furthermore, when the circuit at the side of the subsystem portion 92 is operated at higher speed than the circuit at the side of the main system portion 90, the clock at the side of the main system portion 90 is multiplied by n (where, n is a real number more than 1, for example, 1.5) via an oscillator, etc. The multiplied clock is provided as the clock source of the subsystem portion 92, thereby the circuit at the side of the subsystem portion 92 can be operated at higher speed. When the same clock is provided to both of the main system portion 90 and the subsystem portion 92, it is not necessary to arrange the oscillator, etc.

Figure 20A:
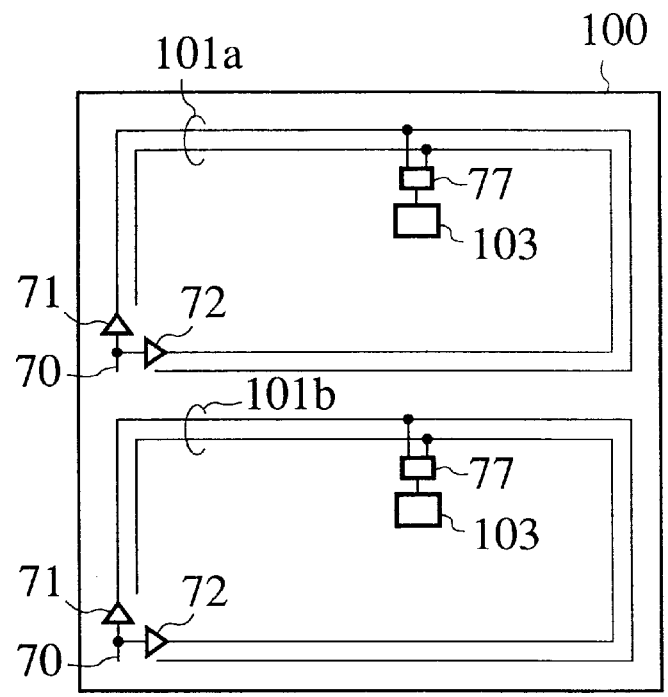
FIGS. 20A and 20B show another application example of the present invention.
Figure 20B:
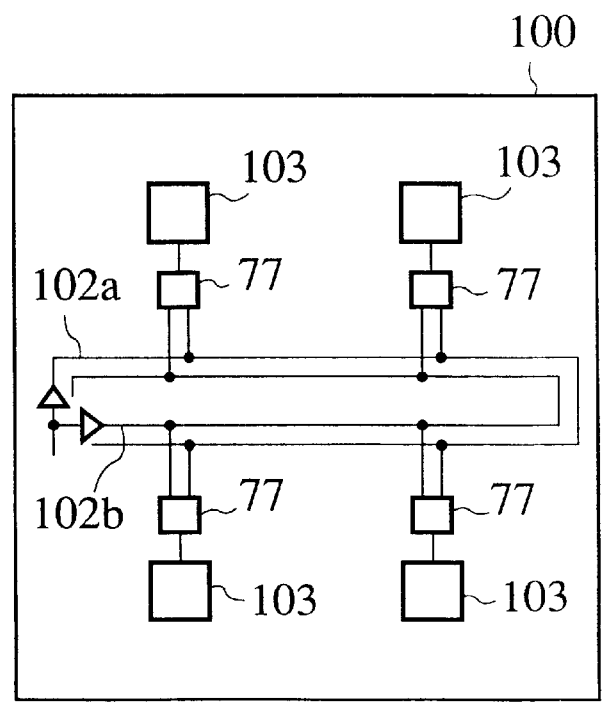

Next, FIGS. 20A and 20B show another application example of the present invention. In FIG. 20A, a plurality of pairs of two clock wires are arranged in the clockwise and counterclockwise directions on a substrate 100, respectively. In this case, two pairs of clock wires 101a, 101b are arranged. On FIG. 20B, two clock wires 102a, 102b are arranged in the clockwise and counterclockwise directions within a less region than FIG. 19 or FIG. 20A at the center portion of on the substrate 100. Various circuits 103 such as the logic circuit, the memory, etc. are arranged around the clock wires 102a, 102b. Here, the substrate 100 may be considered as the board mounting the LSI chip or a plurality of LSI chips. For example, as shown in FIG. 19, the substrate 100 may be also considered as the board mounting the main memory, the cache memory and the logic circuit (CPU, etc.). In such a manner, the arrangement of the clock wires according to the present invention can be appropriately changed and applied according to the layout of various circuits such as the logic circuit, the memory, etc. on the substrate 100.

In case of FIG. 20B, similarly to FIG. 19, there is such an advantage that the layout can become easy.

Furthermore, in FIGS. 17, 18, 19, 20A and 20B showing the embodiments, the two buffers for the input clock are arranged to the clock wires respectively in the clockwise direction and in the counterclockwise direction. However, the two buffers may be substituted with one common buffer. In such an arrangement, the output of the common buffer is branched, thereby the branched output may be provided to the clockwise and counterclockwise clock wires.

According to the above embodiments of the present invention, although the clock is provided by using one wire, even in case that the clock is provided by using two wires having the complementary signal, a set of two wires are arranged, thereby the same effect of a phase matching can be obtained. In this case, the two wires may be transposed.

Furthermore, as described above, the Vcc wire and the Vss wire are arranged at the right and left or at the upper and lower of the clock wire, the clock may be shielded in such a manner that the clock is not influenced by the noise from the adjacent wires.

According to the present invention described above, independently of the position of the circuit, a synchronized clock can be obtained to a branched circuit. Furthermore, according to the present invention, the effect is not deteriorated due to the process dispersion.

It should be understood that many modifications and adaptations of the invention will become apparent to those skilled in the art and it is intended to encompass such obvious modifications and changes in the scope of the claims appended hereto.

What is claimed is:

1. An electronic circuit apparatus having a main system portion and a subsystem portion connected to the main system portion, both the main system portion and the subsystem portion having at least one device installed thereon, wherein at least either said main system portion or said system portion comprising:

a clock source;

a clock wire having a turning point corresponding to a middle point thereof and an outgoing portion and an incoming portion discriminated from each other with respect to the turning point, the outgoing and incoming portions being formed side by side on said main system portion or said subsystem portion, wherein a clock signal from said clock source is inputted to one end of the outgoing portion; and a plurality of clock providing means, each connected to a given position of said outgoing portion, further connected to a position of said incoming portion adjacent to the given position, for supplying a clock signal which has a given delay amount relative to the clock signal from said clock source according to delay amounts at each of the positions relative to the clock signals from the clock source, to said at least one device.

2. An electronic circuit apparatus according to claim 1, further comprising power source wires Vcc and Vss each disposed parallel to said clock wire.

3. An electronic circuit apparatus according to claim 1, wherein the clock source includes an oscillator which provides another clock signal having a frequency resulting from multiplying the frequency of the clock signal relating to said main system portion or said subsystem portion by n (where, n is a real number more than 1) to said subsystem portion or said main system portion.

4. An electronic circuit apparatus having a main system portion and a subsystem portion connected to the main system portion, both the main system portion and the subsystem portion having at least one device installed thereon, wherein at least either said main system or said system comprising:

a clock source;

a clock wire having one end supplied with a clock signal from the clock source and having two branches which extend parallel to each other in directions opposite to each other; and a plurality of clock providing means, each connected to a given position of one branch, further connected to a position of the other branch adjacent to the given position, for supplying a clock signal, which has a given delay amount relative to the clock signal from said clock source according to delay amounts at each of the positions relative to the clock signals from the clock source, to said at least one device.

5. An electronic circuit apparatus according to claim 4, wherein said clock wire is extended at a center portion of said main system portion or said subsystem portion.

6. An electronic circuit apparatus according to claim 4, wherein said clock wire is extended at a peripheral portion of said main system portion or said subsystem portion.

7. An electronic circuit apparatus according to claim 4, wherein each of the two branches comprises two signal lines inputting a complementary signal, respectively.

8. An electronic circuit apparatus according to claim 4, wherein the power source wires Vcc and Vss are disposed parallel to each other at the upper and lower portions or at the right and left portions of each of the two branches.

9. An electronic circuit apparatus according to claim 4, further comprising an oscillator which provides another clock signal having a frequency resulting from multiplying the frequency of the clock signal relating to said main system portion or said subsystem portion by n (where, n is a real number more than 1) to said subsystem portion or said main system portion.

10. An electronic circuit apparatus according to claim 4, further comprising a drive buffer provided in the path of each of said two branches.

11. An electronic circuit apparatus according to claim 10, wherein a drive buffer is provided at an input portion of each of said two branches.

12. An electronic circuit apparatus according to claim 4, further comprising a pair of drive buffers provided at equal intervals in each of said two branches.

13. An electronic circuit apparatus having a main system portion and subsystem portion connected to the main system portion, both the main system portion and the subsystem portion having at least one device installed thereon, wherein at least either said main system or said subsystem comprising:

a clock source;

a clock wire sequentially comprising a delaying portion for forming a waveform, an outgoing and an incoming portion, the outgoing and incoming portions being connected to each other at a turning point thereof and being wired side by side, wherein a clock signal from the clock source is inputted to one end of the delaying portion; and a plurality of clock providing means, each connected to a given position of said outgoing portion, further connected to a position of said incoming portion adjacent to the given position, for supplying a clock signal, which has a given delay amount relative to the clock signal from said clock source according to delay amounts at each of the positions relative to the clock signals from the clock source to said at least one device.

14. An electronic circuit apparatus according to claim 13, wherein each clock providing means comprising:

a first input terminal connected to the given position of said outgoing portion;

a second input terminal connected to the position of said incoming portion which is closest to and corresponds to the given position;

two series-connected variable control delay circuits having one end connected to said first input terminal and the other end connected to a phase comparator, for optionally delaying the clock signal inputted from said first input terminal; and the phase comparator connected to said second input terminal, for detecting a phase difference between the clock signal inputted from said second input terminal and the clock signal delayed by said two variable control delay circuits, and providing said two variable control delay circuits with control signals to change degree of delays according to the detected phase difference.

15. An electronic circuit apparatus according to claim 14, wherein said phase comparator provides the control signals to change degree of delays in said two variable control delay circuits so that said phase difference becomes zero.

16. An electronic circuit apparatus according to claim 13, wherein said delaying portion, said outgoing portion and said incoming portion each have an input terminal connected to a drive buffer, respectively.

17. An electronic circuit apparatus according to claim 13, wherein said clock wire is extended at the center portion of said main system portion or said subsystem portion.

18. An electronic circuit apparatus according to claim 13, wherein said clock wire comprises two signal lines providing a complementary signal.

19. An electronic circuit apparatus according to claim 13, further comprising power source wires Vcc and Vss each disposed parallel to said clock wire.

20. An electronic circuit apparatus according to claim 13, further comprising an oscillator which provides another clock signal having a frequency resulting from multiplying the frequency of the clock signal relating to said main system portion of said subsystem portion by n (where, n is a real number more than 1) to said subsystem portion or said main system portion.

21. An electronic circuit apparatus comprising:

a clock source;

a clock wire sequentially comprising a delaying portion for forming a waveform, an outgoing portion and an incoming portion, the outgoing and incoming portions being connected to each other at a turning point thereof and being wired side by side, wherein a clock signal from the clock source is inputted to one end of the delaying portion; and a plurality of clock providing means, each connected to a given position of said outgoing portion, further connected to a position of said incoming portion which is closest to and corresponds to the given position, for supplying a clock signal, which has a given delay amount relative to the clock signal from said clock source according to a delay amounts at each of the positions relative to the clock signals from the clock source.

22. An electronic circuit apparatus according to claim 21, wherein said clock wire comprises two signal lines providing a complementary signal.

23. An electronic circuit apparatus according to claim 21, further comprising power source wires Vcc and Vss each disposed parallel to said clock wire.

24. An electronic circuit apparatus comprising:

a clock source;

comprising two wires parallel to each other, one end of one wire and the other end of the other wire different from one end corresponding to the one end of the one wire being connected at a branch point, a clock signal from said clock source being inputted to said two wires through the branch point;

a clock wire having one end supplied with a clock signal from the clock source and having two branches which extend parallel to each other in directions opposite to each other; and a pair of drive buffers provided at equal intervals in each of said two clock branches; and a plurality of clock providing means, each connected to a given position of one branch, further connected to a position of the other branch adjacent to the given position, for supplying a clock signal, which has a given delay amount relative to the clock signal from said clock source according to delay amounts at each to the positions relative to the clock signals from the clock source.

25. An electronic circuit apparatus according to claim 24, wherein a drive buffer is provided at an input portion of each of said two branches.

\* \* \* \* \*